(12) United States Patent
Yamamoto et al.

(10) Patent No.: US 7,806,076 B2
(45) Date of Patent: Oct. 5, 2010

(54) DEVELOPING APPARATUS AND METHOD

(75) Inventors: Taro Yamamoto, Kikuchi-gun (JP);
Atsushi Ookouchi, Kikuchi-gun (JP);
Hirofumi Takeguchi, Kikuchi-gun (JP);
Kousuke Yoshihara, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 1317 days.

(21) Appl. No.: 11/201,102

(22) Filed: Aug. 11, 2005

(65) Prior Publication Data
US 2006/0040051 A1    Feb. 23, 2006

(30) Foreign Application Priority Data
Aug. 20, 2004 (JP) ............... 2004-241442

(51) Int. Cl.
*B05C 11/10* (2006.01)
(52) U.S. Cl. ..................... 118/681; 118/686
(58) Field of Classification Search ............ 118/681, 118/686, 320, 323, 321
See application file for complete search history.

(56) References Cited

U.S. PATENT DOCUMENTS

| | | | | |
|---|---|---|---|---|
| 5,571,560 | A | * | 11/1996 | Lin ............... 427/240 |
| 5,625,433 | A | * | 4/1997 | Inada et al. ........... 396/604 |
| 5,658,615 | A | | 8/1997 | Hasebe et al. |
| 5,766,354 | A | * | 6/1998 | Ohmori et al. ........... 118/319 |
| 5,798,140 | A | * | 8/1998 | Parodi et al. ........... 427/240 |
| 5,984,540 | A | * | 11/1999 | Mimasaka et al. ........... 396/604 |
| 5,997,653 | A | * | 12/1999 | Yamasaka ............... 134/2 |
| 2001/0001746 | A1 | * | 5/2001 | Chun et al. ............... 438/780 |

FOREIGN PATENT DOCUMENTS

| | | |
|---|---|---|
| JP | 2002-75854 | 3/2002 |
| JP | 2003-272988 | 9/2003 |
| JP | 2004-071637 | 3/2004 |
| KR | 10-2003-0096485 | 12/2003 |

OTHER PUBLICATIONS

Korean Office Action dated Jun. 24, 2010, in Application No. 10-2005-0076034, 5 pages.

* cited by examiner

*Primary Examiner*—George R Koch, III
(74) *Attorney, Agent, or Firm*—Oblon, Spivak, McClelland, Maier & Neustadt, L.L.P.

(57) ABSTRACT

A developing apparatus for developing a substrate whose surface is coated with a coating solution and then exposed includes a substrate supporting unit for horizontally supporting the substrate, a rotation driving mechanism for rotating the substrate supporting unit forwardly or backwardly with respect to a vertical axis, a developer nozzle, disposed to face a surface of the substrate supported by the substrate supporting unit, having a strip-shaped injection opening extended along a direction extending from a periphery of the substrate toward a central portion thereof, a moving unit for moving the developer nozzle from an outer portion of the substrate toward the central portion thereof, and a controller for controlling operations such that while the substrate is rotated forwardly by the rotation driving mechanism, a developer is supplied through the injection opening to the surface of the substrate by moving the developer nozzle and, then, the substrate is rotated backwardly by the rotation driving mechanism.

7 Claims, 17 Drawing Sheets

DISCHARGE

CONTROLLER

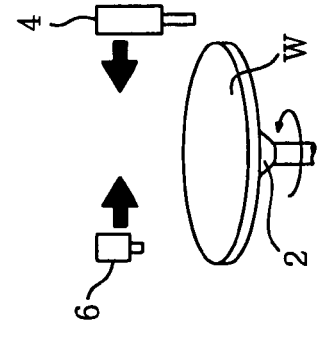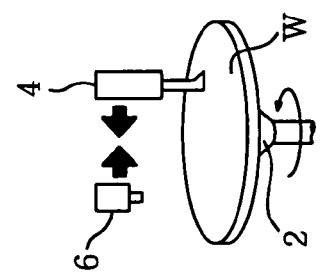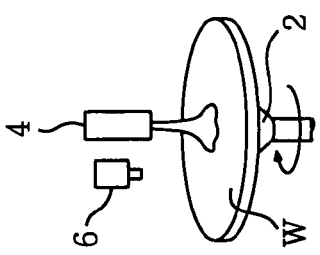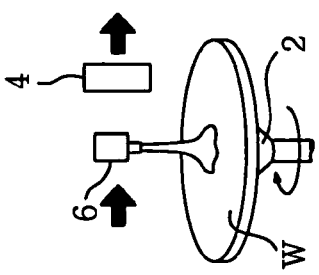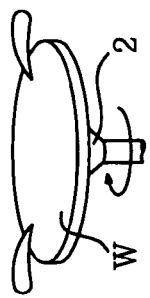

DEVELOPING APPARATUS AND METHOD

FIELD OF THE INVENTION

The present invention relates to a developing apparatus and method, for developing a surface of a substrate coated with a resist and exposed to light.

BACKGROUND OF THE INVENTION

In a photoresist process, one of the semiconductor manufacturing processes, a resist coated on a surface of a semiconductor wafer (hereinafter, referred to as a wafer) is exposed to light by employing a specified pattern and then developed, thereby forming a resist pattern on the surface of the wafer. Such process is generally carried out by using a system in which an exposure device is combined with a coating/developing apparatus for coating and developing a resist.

As illustrated in FIGS. 16A to 16C, for example, in a conventional developing apparatus, a wafer W is horizontally kept on a substrate supporting unit 1, and a developer nozzle 11 having a small injection hole is provided at a position slightly upwardly separated from a surface of the wafer W. By moving the developer nozzle 11 discharging a developer along a radial direction of the wafer W while the wafer W being rotated about a vertical axis, the developer is spirally sprayed on the surface of the wafer W (FIG. 16A). Further, after a developer 12 is sprayed on the surface of the wafer W, the wafer W is stopped from being rotated and developed for a predetermined time period, e.g., 60 seconds (FIG. 16B). Then, a rinse 14, e.g., deionized water, is supplied through a rinse nozzle 13 to a central portion of the wafer W (FIG. 16C). In this way, the insoluble resist portions in the developer are left intact, thereby producing a specific resist pattern.

Moreover, there has been known a technique: a developer is supplied to a wafer W whose surface is coated with a resist having a pattern portion extending in a direction intersecting a rotational direction of the wafer W that is rotating about a vertical axis, and the wafer W is rotated forwardly and backwardly, whereby a resist layer on a sidewall surface of the pattern, that has to be eliminated, is made to be surely removed (see, for example, Japanese Patent Laid-open Publication Nos. 2002-075854 and 2003-272988).

However, the aforementioned developing method has following drawbacks. Since the developer is supplied while the wafer W is rotated about the vertical axis, the developer flows outwardly from the central portion along a parabolic trace in a direction opposite to that of the rotation of the wafer W on the surface of the wafer W. Depending on a shape or layout of a pattern transcribed on a resist by an exposure, when the pattern begins to be revealed due to a contact with the developer, the pattern may hinder the flow of the solution. Accordingly, the developer may not uniformly reach all over the pattern, especially over a downstream side portion of the pattern, thereby deteriorating the accuracy in realizing a precise line width. But, since a nonsmooth solution flow causes only a very slight deterioration in the accuracy in realizing a precise line width and, thus, it was not conventionally considered to be much a problem. However, along with a recent trend of a pattern's miniaturization, it becomes imperative to make the solution flow smooth to achieve a higher degree of accuracy in realizing a precise line width.

Hereinafter, there will be described an exemplary pattern, which is subject to a nonsmooth solution flow. When patterns of multiple chips are transcribed on a surface of a wafer W by an exposure, the patterns are successively transcribed, for example, by moving the wafer W with respect to an exposure device. Thus, the multiple chips are transcribed on the surface of the wafer W along a same direction. The patterns of the chips vary depending on purposes. However, as schematically illustrated in FIG. 17, the pattern of a single chip generally includes a pattern portion 15 and a non-pattern portion 16. In this case, even though the developer is supplied to the wafer W, a resist of a non-pattern portion remains without being dissolved. Accordingly, if the residual resist is positioned at an upstream side of a developer flow, the flow toward a downstream side pattern portion thereof will be hindered.

SUMMARY OF THE INVENTION

It is, therefore, an object of the present invention to provide a developing apparatus and method, whereby when a substrate whose surface has a resist coated thereon and is exposed to light is rotated and provided with the developer, a developer flow can be controlled on the substrate and a pattern having a high in-surface uniformity can be formed.

In accordance with one aspect of the invention, there is provided a developing apparatus for developing a substrate whose surface is coated with a coating solution and then exposed, the apparatus including a substrate supporting unit for horizontally supporting the substrate; a rotation driving mechanism for rotating the substrate supporting unit forwardly or backwardly with respect to a vertical axis; a developer nozzle, disposed to face a surface of the substrate supported by the substrate supporting unit, having a strip-shaped injection opening extended along a direction extending from a periphery of the substrate toward a central portion thereof; a moving unit for moving the developer nozzle from an outer portion of the substrate toward the central portion thereof; and a controller for controlling operations such that while the substrate is rotated forwardly by the rotation driving mechanism, a developer is supplied through the injection opening to the surface of the substrate by moving the developer nozzle and, then, the substrate is rotated backwardly by the rotation driving mechanism.

Preferably, patterns of chips may be regularly formed on a resist of the surface of the substrate, and each of the chips has a dense pattern portion and a sparse pattern portion. Further, when the substrate is rotated backwardly, the controller may control the developer to be discharged through the injection opening onto the central portion of the substrate. Furthermore, when the substrate is rotated backwardly, the controller may control the developer nozzle to move from the outer portion of the substrate toward the central portion thereof while discharging the developer through the injection opening. Moreover, when the rotation of the substrate is converted from the forward direction to the backward direction, the substrate may be stopped momentarily.

In accordance with another aspect of the invention, there is provided a developing apparatus for developing a substrate whose surface is coated with a coating solution and then exposed, the apparatus including a substrate supporting unit for horizontally supporting the substrate; a rotation driving mechanism for rotating the substrate supporting unit with respect to a vertical axis; a developer nozzle, disposed to face a surface of the substrate supported by the substrate supporting unit, having a strip-shaped injection opening extended along a direction extending from a periphery of the substrate toward a central portion thereof, the injection opening being inclined toward the central portion of the substrate; a moving unit for moving the developer nozzle from an outer portion of the substrate toward the central portion thereof; and a fluid supply nozzle, disposed to face the surface of the substrate supported by the substrate supporting unit, for supplying a fluid to push the developer supplied from the developer nozzle to the central portion of the substrate; and a moving mechanism for moving the fluid supply nozzle from the outer portion of the substrate toward the central portion thereof along with the developer nozzle. For example, the fluid may be a diluted developer or a gas.

In accordance with still another aspect of the invention, there is provided a developing apparatus for developing a substrate whose surface is coated with a coating solution and then exposed, the apparatus including a substrate supporting unit for slantingly supporting the substrate at an inclined angle; a rotation driving mechanism for rotating the substrate supporting unit with respect to a perpendicular axis; a developer nozzle, disposed to face a surface of the substrate supported by the substrate supporting unit, having a strip-shaped injection opening extended along a direction extending from a periphery of the substrate toward a central portion thereof; a moving unit for moving the developer nozzle from an outer portion of the substrate toward the central portion thereof; and a controller for controlling operations such that while the substrate is rotated forwardly by the rotation driving mechanism, a developer is supplied through the injection opening to the surface of the substrate by moving the developer nozzle. The inclined angle may range from, e.g., 1° to 10°.

In accordance with still another aspect of the invention, there is provided a developing apparatus for developing a substrate whose surface is coated with a coating solution and then exposed, the apparatus including a substrate supporting unit for horizontally supporting the substrate; a rotation driving mechanism for rotating the substrate supporting unit with respect to a vertical axis, which is provided at an eccentric position on the substrate; a developer nozzle, disposed to face a surface of the substrate supported by the substrate supporting unit, having a strip-shaped injection opening extended along a direction extending from a periphery of the substrate toward a central portion thereof; a moving unit for moving the developer nozzle from one end portion of the substrate toward the other end portion thereof, the end portions being positioned on a straight line passing through the eccentric position and the center of the substrate; and a controller for controlling operations such that the substrate is oscillated left and right by the rotation driving mechanism and a developer is supplied through the injection opening to the surface of the substrate by moving the developer nozzle.

In accordance with still another aspect of the invention, there is provided a developing method for developing a substrate whose surface is coated with a coating solution and then exposed, the method including the steps of horizontally supporting a bottom surface of the substrate by using a substrate supporting unit; rotating the substrate supported by the substrate supporting unit forwardly with respect to a vertical axis; discharging a developer through a strip-shaped injection opening provided at the developer nozzle onto a surface of the substrate while moving the developer nozzle, the injection opening extended along a direction extending from a periphery of the substrate to a central portion thereof; and rotating the substrate supported by the substrate supporting unit backwardly with respect to the vertical axis after the developer nozzle reaches the central portion of the substrate.

Preferably, patterns of chips may be regularly formed on a resist of the surface of the substrate, and each of the chips has a dense pattern portion and a sparse pattern portion. Further, when the substrate supported by the substrate supporting unit is rotated backwardly with respect to the vertical axis, the developer is discharged through the injection opening to the central portion of the substrate. Furthermore, when the substrate supported by the substrate supporting unit is rotated backwardly with respect to the vertical axis, the developer nozzle is moved from the outer portion of the substrate toward the central portion thereof while discharging the developer through the injection opening. Moreover, when the rotation of substrate is converted from the forward rotation to the backward rotation, the substrate is stopped momentarily.

In accordance with still another aspect of the invention, there is provided a developing method for developing a substrate whose surface is coated with a coating solution and then exposed, the method including the steps of horizontally supporting a bottom surface of the substrate by using a substrate supporting unit; rotating the substrate supported by the substrate supporting unit around a vertical axis; moving a developer nozzle facing a surface of the substrate from an outer portion of the substrate toward a central portion thereof; discharging a developer through a strip-shaped injection opening provided at the developer nozzle onto a surface of the substrate while moving the developer nozzle, the injection opening extended along a direction extending from a periphery of the substrate to the central portion thereof; and supplying fluid from a fluid supply nozzle to the surface of the substrate, wherein the fluid supply nozzle moves along with the developer nozzle and the fluid is for pushing the developer, which is supplied from the developer nozzle to the surface of the substrate, toward the central portion of the substrate. For example, the fluid may be a diluted developer or a gas.

In accordance with still another aspect of the invention, there is provided a developing method for developing a substrate whose surface is coated with a coating solution and then exposed, the method including the steps of slantingly supporting the substrate a bottom surface of the substrate at an inclined angle by using a substrate supporting unit; rotating the substrate supported by the substrate supporting unit with respect to a perpendicular axis; moving a developer nozzle facing a surface of the substrate from an outer portion of the substrate toward a central portion thereof; and discharging a developer from a strip-shaped injection opening provided at the developer nozzle onto a surface of the substrate, the injection opening extended along a direction extending from a periphery of the substrate to the central portion thereof. The inclined angle may range from, e.g., 1° to 10°.

In accordance with still another aspect of the invention, there is provided a developing method for developing a substrate whose surface is coated with a coating solution and then exposed, the method including the steps of horizontally supporting the substrate on a backside thereof by using a substrate supporting unit; oscillating the substrate supported by the substrate supporting unit left and right with respect to a vertical axis, which is provided at an eccentric position on the substrate; moving a developer nozzle facing a surface of the substrate from one end portion of the substrate toward the other end portion thereof, the end portions being positioned on the straight line passing through the eccentric position and the center of the substrate; and discharging a developer through a strip-shaped injection opening provided at the developer nozzle onto a surface of the substrate while moving the developer nozzle, the injection opening extended along a direction extending from a periphery of the substrate to a central portion thereof.

In accordance with the present invention, after the developer is supplied in a spiral shape while the wafer W is rotated forwardly, the wafer W is then rotated backwardly. Accordingly, a flow pattern of the developer is changed on the wafer W, so that the developer can uniformly reach all over the fine pattern in comparison with one-way flow of the developer. As a result, the developer can reach all fine parts of the pattern, thereby producing a pattern of a highly uniform line width after a developing process.

Moreover, the flow pattern of the developer on the substrate surface can be changed also in cases where: a developer is supplied through an injection opening inclined toward a central portion of the substrate and then pushed toward the central portion thereof by fluid supplied along behind the developer; the substrate is supported in an inclined state; and the substrate is oscillated left and right around an eccentric position on the substrate. As a result, the aforementioned effects of the present invention can be also realized in these cases.

BRIEF DESCRIPTION OF THE DRAWINGS

The above and other objects and features of the present invention will become apparent from the following description of preferred embodiments, given in conjunction with the accompanying drawings, in which:

FIGS. 6A to 6E present a flowchart of a wafer developing process using the developing apparatus;

DETAILED DESCRIPTION OF THE PREFERRED EMBODIMENT

Figure 1:
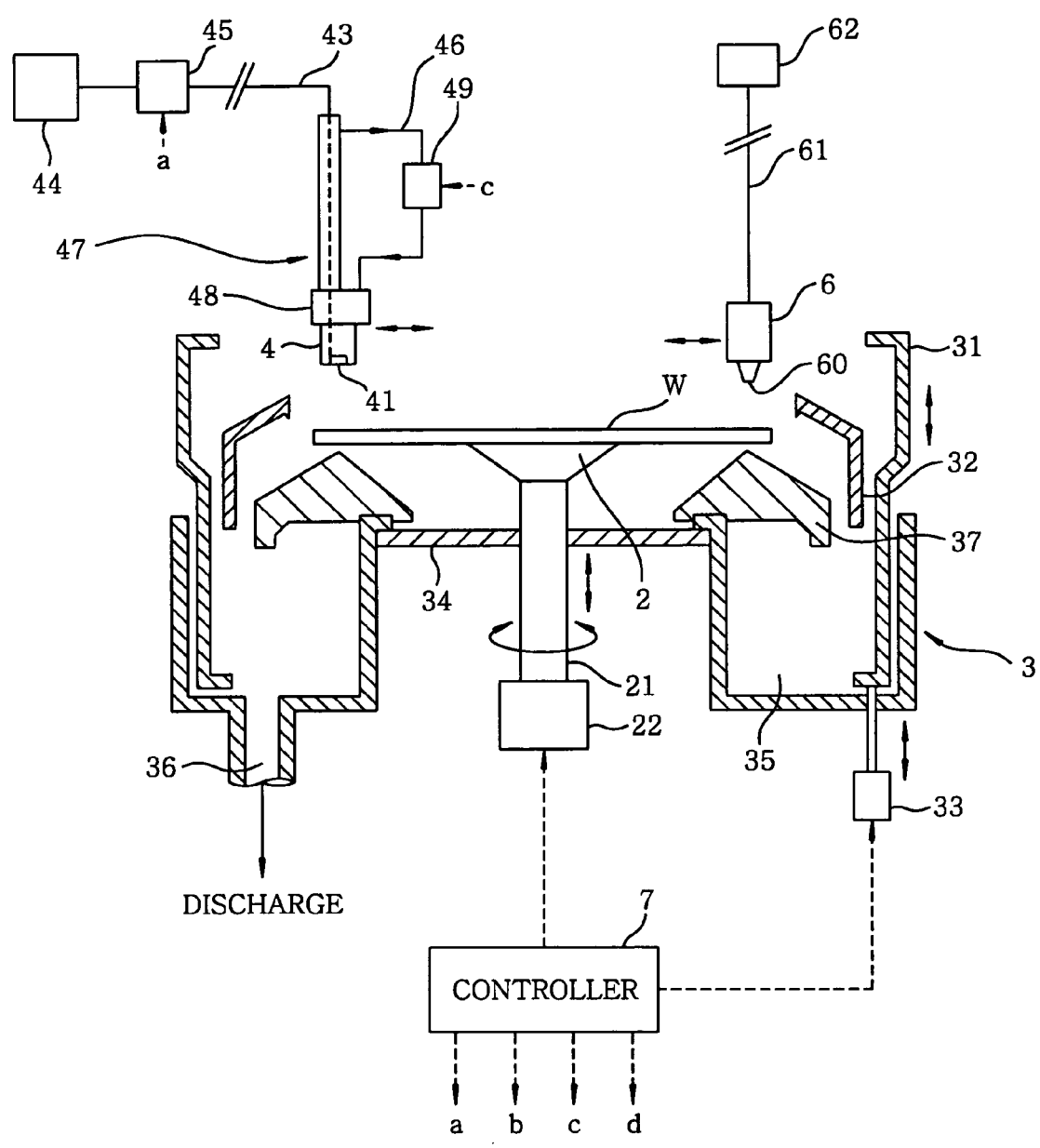
FIG. 1 is a vertical sectional view of a developing apparatus in accordance with a preferred embodiment of the present invention.
Figure 2:
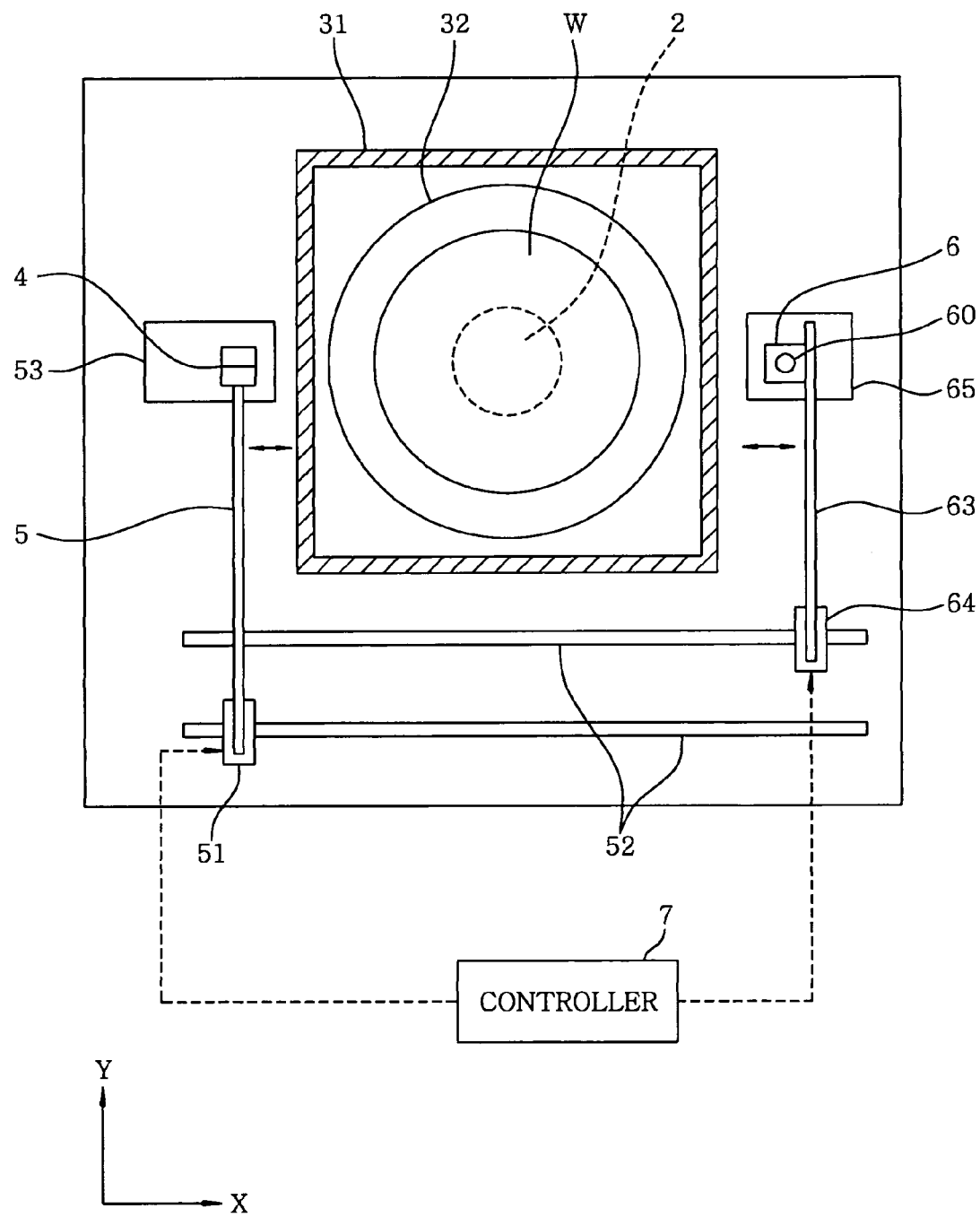
FIG. 2 shows a top view of the developing apparatus in accordance with the preferred embodiment of the present invention.

A developing apparatus in accordance with a preferred embodiment of the present invention will be described with reference to FIGS. 1 and 2. A reference numeral 2 indicates a spin chuck serving as a substrate supporting unit for horizontally supporting a substrate, e.g., a wafer W, by holding a central bottom surface thereof with a help of vacuum adsorption. The spin chuck 2 is connected to a driving mechanism 22, e.g., a motor, forming a rotation driving mechanism via a rotational shaft 21. Further, the spin chuck 2 can be elevated up and down while supporting the wafer W and also pivot on a vertical axis either clockwise or counterclockwise. That is, the spin chuck 2 can be rotated forwardly and backwardly while supporting the wafer W. In addition, a cup body 3 whose upper portion is opened is installed to surround the wafer W supported by the spin chuck 2. In this embodiment, a center of the wafer W is set to be positioned on a rotation axis (a rotation center) of the spin chuck 2. However, in the present invention, the center of the wafer W may not be necessarily positioned on the rotation axis. For instance, the center of the wafer W may be positioned in a region within a radius of 1 mm~1.5 mm from the rotation axis. Further, the cup body 3 includes an outer cup 31 having quadrilateral upper portion and a cylindrical lower portion; and a cylindrical inner cup 32 having an inwardly slanting upper portion, wherein the outer cup 31 can vertically move up and down by an elevator 33.

A circular plate 34 is provided under the wafer W supported by the spin chuck 2, and a liquid-receiving section 35 having a recessed cross section is installed to surround the whole circular plate 34. Further, a drain port 36 is formed at a bottom of the liquid-receiving section 35. Furthermore, a ring member 37 having a mountain-shaped cross section is installed at the outside of the circular plate 34. Although it is not shown, there are provided three elevating pins, serving as substrate supporting pins, penetrating through the circular plate 34. The wafer W is transferred on the spin chuck 2 by operating a substrate transfer mechanism (not shown) as well as the elevating pins.

Figure 3:
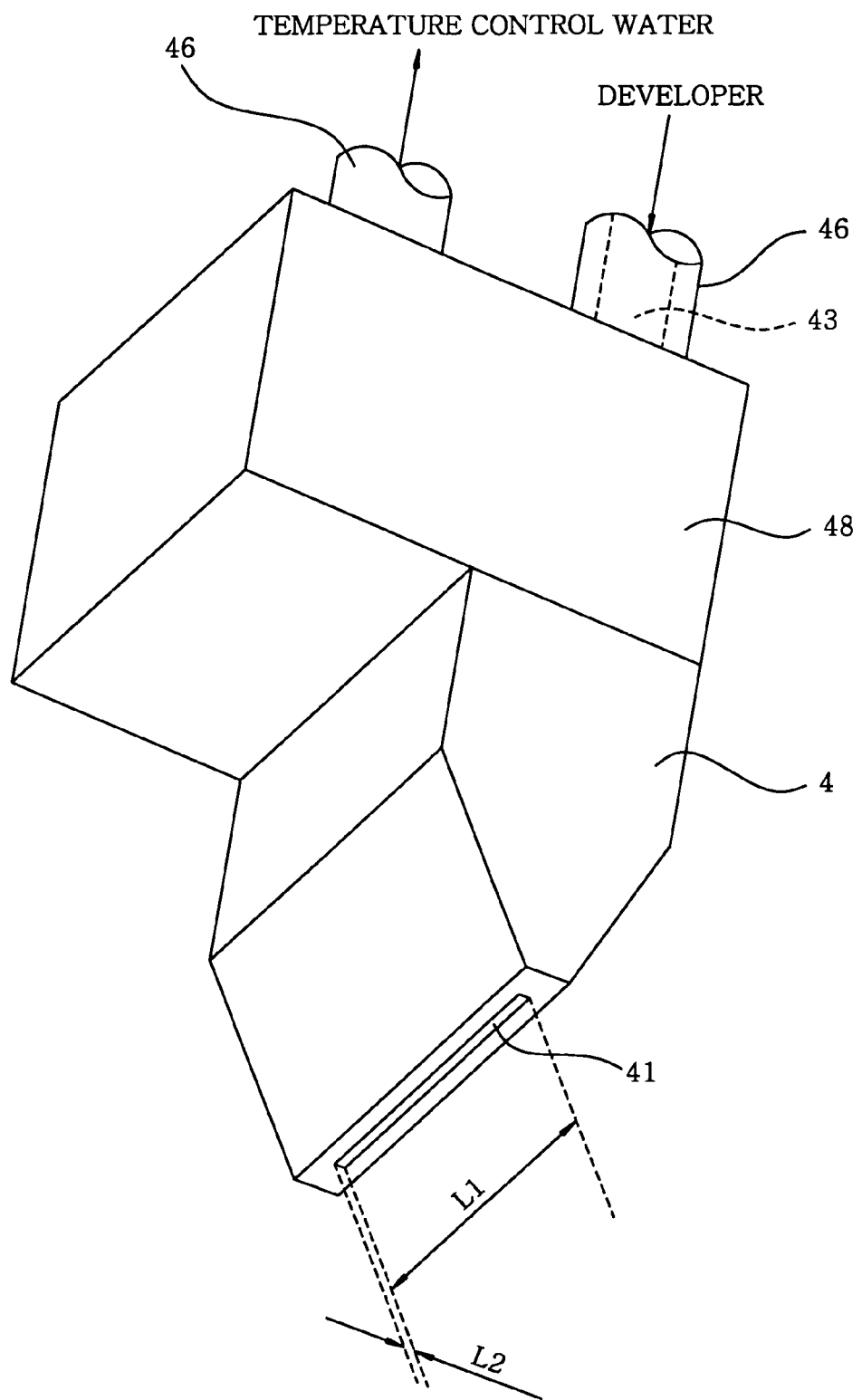
FIG. 3 illustrates a perspective view of a developer nozzle of the developing apparatus.

Installed above the wafer W supported by the spin chuck 2 is a vertically and horizontally movable developer nozzle 4 facing a surface of the wafer W. Hereinafter, the developer nozzle 4 will be described in detail with reference to FIGS. 3 and 4. The developer nozzle 4 is formed in, e.g., a wedge shape so that a width thereof becomes narrower toward a lower portion thereof. Further, installed on a lower end surface thereof is a strip-shaped, e.g., slit-shaped, injection opening 41 for discharging the developer, which has a length L1 of 8 mm~15 mm and a width L2 of 0.1 mm~1 mm. The injection opening 41 is arranged in such a way that a longitudinal direction thereof extends along a direction drawn from a periphery of the wafer W to a central portion thereof. Herein, "a slit shape extending from the periphery to the central portion" includes not only a slit extending along a straight line (a radius) from one peripheral point to the center of the wafer W but also a slit intersecting the straight line at a small angle. Further, "a strip shape" includes a strip having a non-rectangular cross section, e.g., a trapezoid or a quadrangle having wave-shaped sides, as well as an actual strip having a rectangular cross section, which is preferable.

Figure 4:
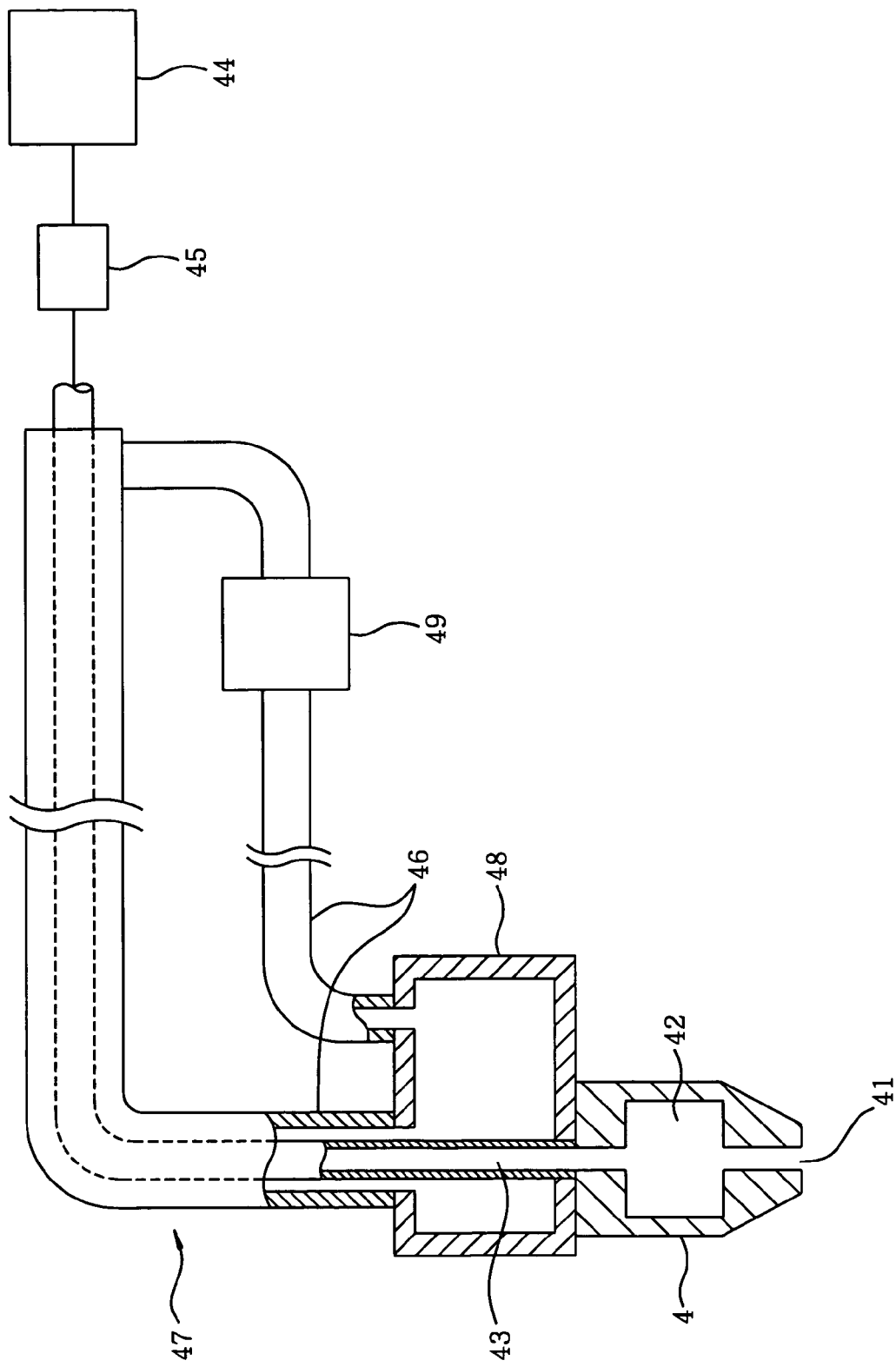
FIG. 4 describes a vertical sectional view of the developer nozzle of the developing apparatus.

To be more specific, as depicted in FIG. 4, the injection opening 41 is configured to communicate with a liquid reservoir 42 formed thereinside. The liquid reservoir 42 is connected to one end of a supply line, e.g., a developer pipe 43. Meanwhile, the other end of the developer pipe 43 is connected to a developer supply source 44. Installed in the middle of the developer pipe 43 are a main temperature control unit 45, e.g., a heat exchanger, for controlling a temperature of the developer; a liquid transfer unit (not shown), e.g., a bellows pump capable of controlling a discharge flow rate by changing a discharge stroke; and the like. Further, a flow path of a temperature control water, e.g., one of temperature control water pipes 46, is provided to surround a portion of the developer pipe 43 in a region extending from the vicinity of an upper surface of the developer nozzle 4 to an upstream side portion of the pipe 43, thereby forming a double pipe 47 in which the developer pipe 43 and the temperature control water pipe 46 are disposed coaxially. That is, the double pipe 47 functions as an auxiliary temperature control unit capable of controlling the temperature of the developer to be kept at a specified temperature in that a heat exchange occurs between the developer and the temperature control water via a pipe wall for separating them. Moreover, the temperature control water pipes 46 extending from both ends of the double pipe 47 are connected to each other, thereby forming a circulation path. Installed in the middle of the circulation path are a temperature control water reservoir 48 and a temperature control unit 49, e.g., a heat exchanger, for controlling a temperature of the temperature control water. In other words, the temperature of the developer can be controlled to be kept at a specified temperature, e.g., 5° C.~60° C., by the main temperature control unit 45 and the double pipe 47 serving as an auxiliary temperature control unit. Herein, "main" and "auxiliary" are used for simplicity of description. Further, it is not necessarily needed to provide both of the main temperature control unit 45 and the double pipe 47 serving as an auxiliary temperature control unit, and either providing both of them or providing just one of them may be good enough.

Referring back to FIG. 2, the developer nozzle 4 is supported at one end portion of the nozzle arm 5 serving as a supporting member. Further, the other end portion of the nozzle arm 5 is connected to a moving platform 51 having an elevating mechanism (not shown). The moving platform 51 is horizontally movable along a guide member 52 extending in, e.g., an X direction on the bottom surface of an outer body of the apparatus. A reference numeral 53 indicates a standby section of the developer nozzle 4, wherein the nozzle standby section 53 performs a cleaning or the like for a leading end portion of the nozzle.

A vertically and horizontally movable rinse nozzle 6 having a small injection hole 60 for discharging a rinse, e.g., pure water, is installed to face the surface of the wafer W. The rinse nozzle 6 is connected to one end of a supply line, e.g., a rinse line 63. Meanwhile, the other end of the rinse line 63 is connected to a rinse supply source 62. Installed in the middle of the rinse line 63 is a liquid transfer unit (not shown), e.g., a bellows pump capable of controlling a discharge flow rate by changing a discharge stroke, and the like. Besides, the rinse nozzle 6 is connected to a moving platform 64 having an elevating mechanism (not shown) via the nozzle arm 63, and the moving platform 64 can move horizontally along the guide member 52. A reference numeral 65 indicates a standby section of the rinse nozzle 6.

A reference numeral 7 indicates a controller, and the controller 7 controls operations of the driving mechanism 22, the elevator 33 and the moving platforms 51 and 64. To be specific, the controller 7 can perform following operations: while the wafer W is rotated forwardly by the driving mechanism 22, a developer is supplied through the injection opening 41 to the surface of the wafer by moving the developer nozzle 4 from the outside of the substrate toward the center thereof and, then, the wafer W is rotated backwardly by the driving mechanism 22 thereafter. Further, the controller 7 controls temperatures of the main temperature control unit 45 and the double pipe 47 serving as an auxiliary temperature control unit so that the developer supplied to the surface of the wafer W is kept at a specified temperature, e.g., 5° C.~60° C. To be more specific, information on temperature setting values of the developer that are set corresponding to the kinds of resists is stored in a storage unit, e.g., a memory, included in the control unit 7, and a temperature setting value of the developer is determined within a range of 5° C.~60° C. based on the kind of a resist coated on the wafer W to be developed. In other words, the temperature of the developer is controlled based on resist solubility in the developer. Further, if temperature setting values of the developer can be determined based on the respective resists kinds, the memory of the control unit 7 does not necessarily store therein such information and, for example, an operator may input the temperature setting values via an input unit of the control unit 7.

There will be now described exemplary temperature setting values of the developer corresponding to resist kinds. For instance, as for a KrF resist, if there is provided a resist having a low solubility in the developer, the temperature setting value of the developer is set to range from 40° C. to 60° C. Further, as for an ArF resist under consideration for availability, if there is provided a resist having a high solubility in the developer, the temperature setting value of the developer is set to range from 20° C. to 40° C. Besides, if there is provided a resist for an I-ray source, a G-ray source or the like, having a higher solubility at a low temperature, the temperature setting value is set to range from 10° C. to 20° C. Typically, a resist solubility speed is used for distinguishing a KrF resist from an ArF resist. But, the temperature of the developer is determined by examining a temperature at which the solubility of the resist is promoted, not depending on whether a resist is the KrF resist or the ArF resist.

Figure 5A:
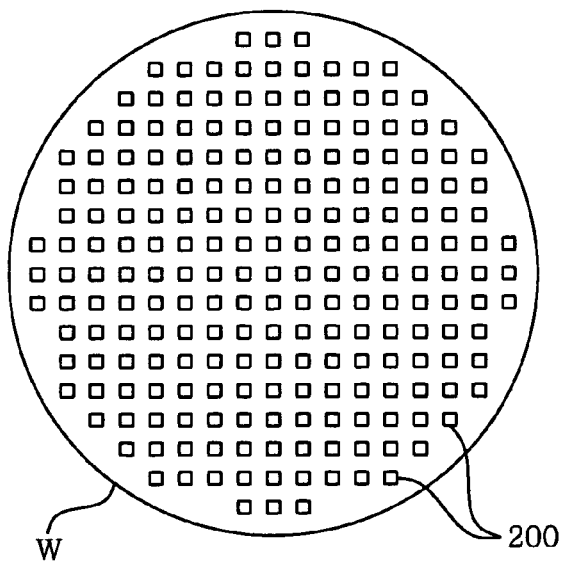
FIGS. 5A and 5B depict diagrams for explaining an exemplary wafer W to be developed by the developing apparatus.
Figure 5B:
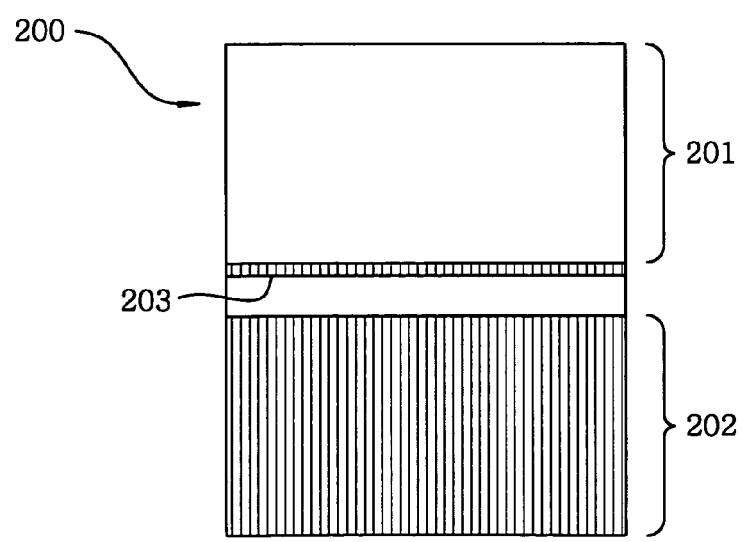

Hereinafter, an exemplary pattern transcribed by an exposure to light on a surface of a substrate, e.g., wafer W, to be developed by the aforementioned developing apparatus will be described with reference to FIGS. 5A and 5B. As illustrated in FIG. 5A, patterns on chips 200 for devices are transcribed on the surface of the wafer W by the exposure, the patterns being vertically and horizontally spaced apart from each other at regular intervals. The following is a detailed description of the patterns on the chips 200. As schematically depicted in FIG. 5B, a dense pattern portion 201, wherein no pattern is formed and a dense resist is left, and a sparse pattern portion 202, wherein a pattern is formed and a sparse resist is left, are arranged side by side. Although it is not applied to all chips 200 on the surface of the wafer, if the wafer W is rotated around a vertical axis, chips 200, each having the dense pattern portion 201 and the sparse pattern portion 202 arranged side by side in the rotational direction, seem to be transcribed on the wafer W. Further, a reference numeral 203 indicates a testing pattern for examining an accuracy in realizing a precise line width after the developing process. The chip's patterns shown in FIGS. 5A and 5B are reference patterns in a process of designing a circuit line width. Although the patterns are extremely simplified by exaggerating the denseness and sparseness in their density and indicated by straight lines, in reality, the patterns are formed of real specified circuit patterns.

Hereinafter, a process for developing a substrate, e.g., a wafer by using the developing apparatus will be described with reference to FIGS. 6A to 6E. First of all, the outer cup 31 and the inner cup 32 are lowered and, further, the developer nozzle 4 and the rinse nozzle 6 are provided above the nozzle standby sections 53 and 65, respectively. In such state, if a wafer W whose surface is coated with a resist and is exposed to light is loaded by a substrate transfer mechanism (not shown), the wafer W is loaded on the spin chuck 2 by a corporative operation of substrate transfer mechanism and an elevating pin (not shown).

Next, the outer cup 31 is elevated. Further, as described in FIG. 6A, the developer nozzle 4 is positioned at a spot where the developer begins to be discharged, e.g., at a spot slightly outwardly separated from one end portion of the wafer W and slightly above from the surface of the wafer W. Furthermore, the rinse nozzle 6 is arranged so that an injection opening 60 is slightly outwardly separated from the other end portion of the wafer W and slightly above from the surface of the wafer W.

Thereafter, as shown in FIG. 6B, the wafer W is rotated forwardly, e.g., clockwise, about the vertical axis at a rotational speed of, e.g., 500 rpm~1200 rpm. At the same time, the developer nozzle 4 is moved from an outer portion of the wafer W to a central portion thereof, i.e., in a rotation radial direction of the wafer W, while discharging the developer through the injection opening 41 in a strip shape. Accordingly, the developer is supplied to an entire surface of the wafer W in a spiral shape. As for the wafer W having a diameter of, e.g., 8 inches, the nozzle is set to have a moving speed at which the injection opening 41 can reach above the center of the wafer W in 1~2 seconds. In the meantime, as soon as the developer nozzle 4 is moved, the rinse nozzle 6 is synchronously moved in a rotation radial direction of the wafer W so as to face the developer nozzle 4 until it is positioned at a vicinity (a standby position) of the developer nozzle 4. In other words, if a rinse discharge position is set to be above the center of the wafer W, the rinse nozzle 6 is stopped right in front of the rinse discharge position.

As illustrated in FIG. 6C, once the developer nozzle 4 is moved to a position above the center of the wafer W, the discharge of the developer is stopped at the position. Meanwhile, a forward rotation of the wafer w is reversed to a backward rotation, and the wafer W is rotated backwardly, e.g., counterclockwise, at a rotation speed of, e.g., 500 rpm to 1200 rpm. Specifically, since the forward rotation of the driving mechanism 22 serving as a motor is completely stopped first and then, a current for the backward rotation thereof begins to be supplied, there is a pausing time between the forward rotation and the backward rotation. As soon as the wafer starts to be rotated backwardly, the developer begins to be discharged through the developer nozzle 4 to be supplied to the central portion of the wafer W.

At this time, since the wafer W is rotating, the developer spreads outwardly on the surface of the wafer W due to a centrifugal force, thereby forming a thin liquid film on the surface of the wafer W. Further, a soluble portion of the resist is dissolved in the developer and, then, an insoluble portion remains to form a pattern. To be precise, even if adjacent streams of the developer, which is discharged in a strip shape, have a slight gap therebetween or are overlapped partially while supplying the developer, the developer streams are merged by the rotation of the wafer W, which is included in the present invention.

After the developer is discharged through the developer nozzle 4 to the central portion, e.g., for a specified time period, the developer nozzle 4 stops discharging and is quickly retreated. Next, as illustrated in FIG. 6D, instead of the developer nozzle 4, the rinse nozzle 6 is positioned at a spot above the center of the wafer W. A rinse is quickly discharged through the rinse nozzle 6, e.g., for a specified time period, so that the rinse is supplied to the surface of the wafer W. The rinse is preferably supplied at the latest before the developer becomes dry and, for example, the rinse is supplied right before the discharge of the developer is stopped, or within 2 seconds after the discharge of the developer is stopped.

The rinse supplied to the surface of the wafer W spreads outwardly on the surface thereof due to a centrifugal force of the wafer W's rotation and washes away the developer containing the dissolved resist on the surface of the wafer W, thereby cleaning the surface of the wafer W. Once the rinse nozzle 6 stops discharging the rinse and is retreated, then, as shown in FIG. 6E, the wafer W is rotated at a high speed of, e.g., 2000 rpm, thereby carrying out a spin dry process for removing liquid from the surface thereof. Next, the outer cup 31 is lowered and the wafer W is unloaded by the substrate transfer mechanism (not shown), thereby completing the developing process.

Figure 7A:
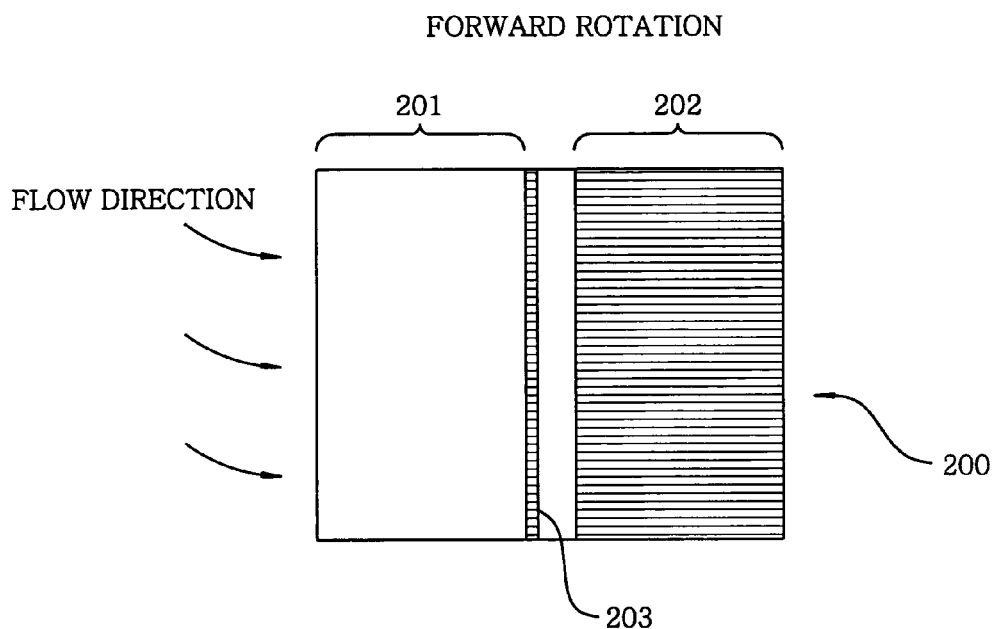
FIGS. 7A and 7B represent diagrams for explaining a flow pattern of a developer supplied to a surface of a wafer.
Figure 7B:
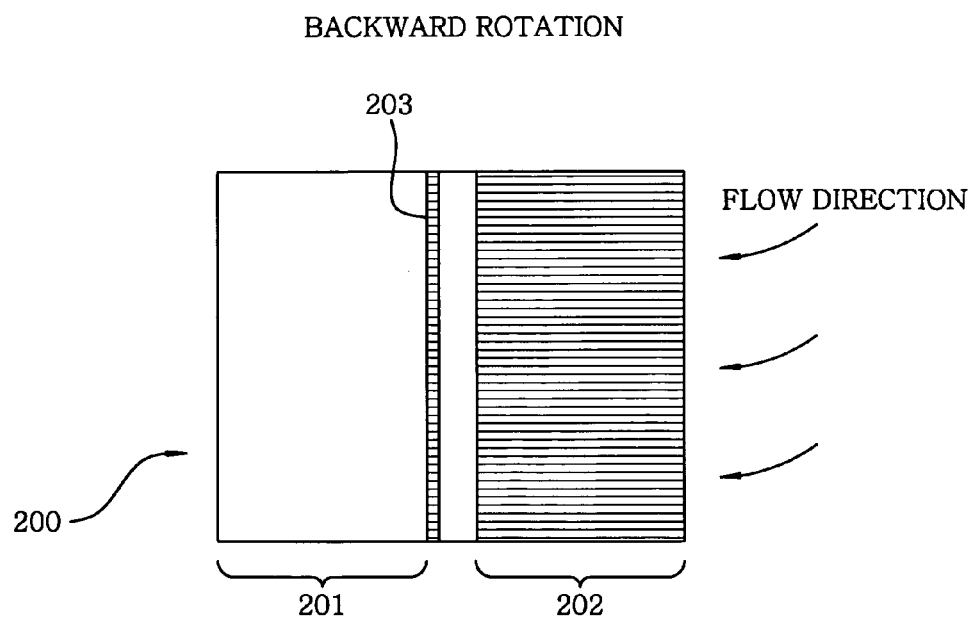

In accordance with the aforementioned embodiment, after the developer is supplied in a spiral shape while the wafer W being rotated forwardly, the wafer W is then rotated backwardly. Accordingly, a flow pattern of the developer is changed on the wafer W, so that the developer can reach all over the fine pattern much more uniformly in comparison with one-way flow of the developer. To be more specific, as illustrated in FIGS. 7A and 7B, the developer flows from the dense pattern portion 201 toward the sparse pattern portion 202 during the forward rotation, whereas it flows from the sparse portion 202 toward the dense pattern portion 201 during the backward rotation. Accordingly, even if the flow is hindered by the dense pattern portion 201 during the forward rotation, the developer can reach all over the sparse pattern portion 202 during the backward rotation. As a result, the developer can reach all fine parts of the pattern, thereby producing a pattern of a highly uniform line width after a developing process.

Figure 8:
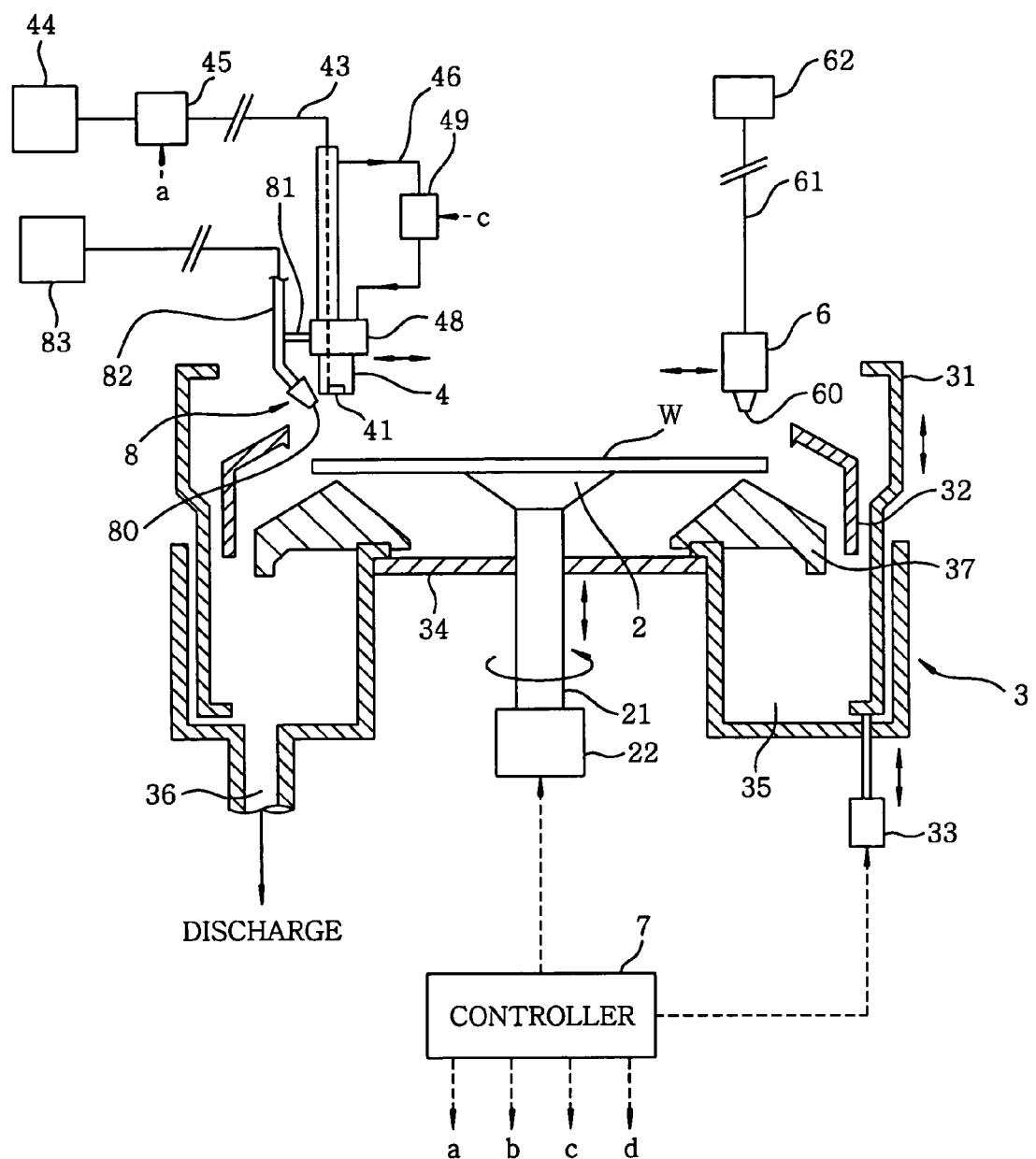
FIG. 8 provides a vertical sectional view of a developing apparatus in accordance with another preferred embodiment of the present invention.

Hereinafter, a developing apparatus in accordance with another preferred embodiment of the present invention will be described with reference to FIGS. 8 and 9. The developing apparatus of this embodiment has the same configuration as the apparatus described in FIG. 1 except that: the injection opening 41 of the developer nozzle 4 is inclined toward the central portion of the wafer W; there is provided a fluid supply unit for supplying a fluid for pushing a developer D, which is supplied through the developer nozzle 4 to the surface of the substrate such as the wafer W, toward the central portion of the wafer W; and the wafer W is not rotated forwardly and backwardly when the developer is discharged. Like reference numerals will be given to like parts and, further, a detailed explanation thereof will be omitted. The injection opening 41 of the developer nozzle 4 is inclined toward the central portion by a specified angle $\theta 1$ of, e.g., 5°~45°, with respect to a vertical axis. Further, a fluid supply nozzle 8 having an injection opening 80 inclined inwardly and downwardly is provided at the rear of the developer nozzle 4, which is opposite to a moving direction of the developer nozzle 4. The fluid supply nozzle 8 supplies a fluid slantingly to the surface of the wafer W provided with the developer D, thereby pushing the developer D toward the central portion. The fluid supply nozzle 8 is supported in combination with the developer nozzle 4 as a single unit by the supporting member 81. Accordingly, the fluid supply nozzle 8 is configured to slidably move from the outer portion of the wafer W toward the central portion thereof along with the developer nozzle 4. Moreover, the fluid supply nozzle 8 is connected to a fluid supply source 83 via a supply line 82 such as piping and, further, a flow rate control unit (not shown) is installed in the middle of the supply line 82.

Figure 9:
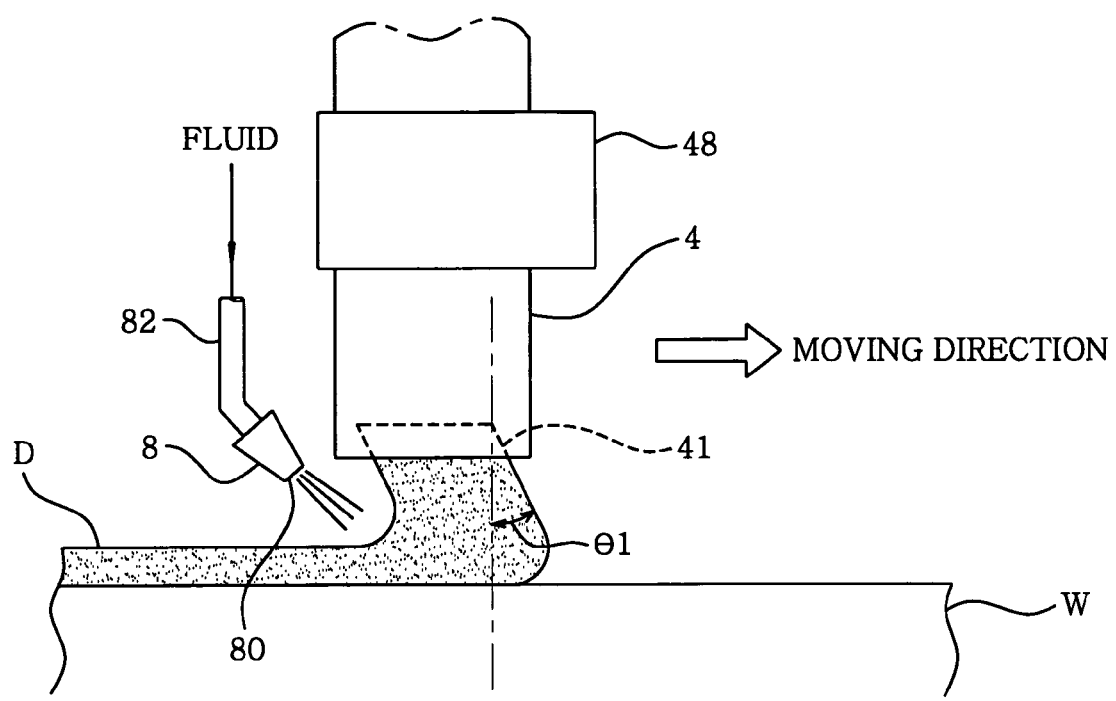
FIG. 9 offers a diagram for explaining a flow pattern of a developer supplied to a surface of a wafer.

In such configuration, the developer nozzle 4 will scan through the surface of the wafer W while the developer D being discharged through the injection opening 41 and, at the same time, the fluid supply nozzle 8 will scan through by following the scanning of the developer nozzle 4 while a fluid, e.g., a diluted developer or a nonreactive gas such as a nitrogen gas, being discharged through the injection opening 80 (see FIG. 9). In this case, the developer D is slantingly supplied along a direction toward inner lower part and, further, the developer D is pushed toward the central portion of the wafer w by spraying fluid. Accordingly, for example, if the rotational speed is set to range from 500 rpm to 1500 rpm (although the range will vary depending on the number of rotations), though momentarily, there is formed a flow of solution against a centrifugal force such that the solution flows from the outer portion of the wafer W to the inner portion thereof. After that, the solution flows from the inner portion to the outer portion due to a centrifugal force. As a result, at a certain point on the surface of the wafer W, there are formed two oppositely running flows of the solution, i.e., a flow from the outer portion to the inner portion and another from the inner portion to the outer portion. Such solution flows facilitate removing dissolved resist, thereby producing a pattern having a highly accurate line width. Further, in this embodiment, it is not essential to provide both of the inclined injection opening 41 and the fluid supply nozzle 8 and providing just one of them may do.

Figure 10:
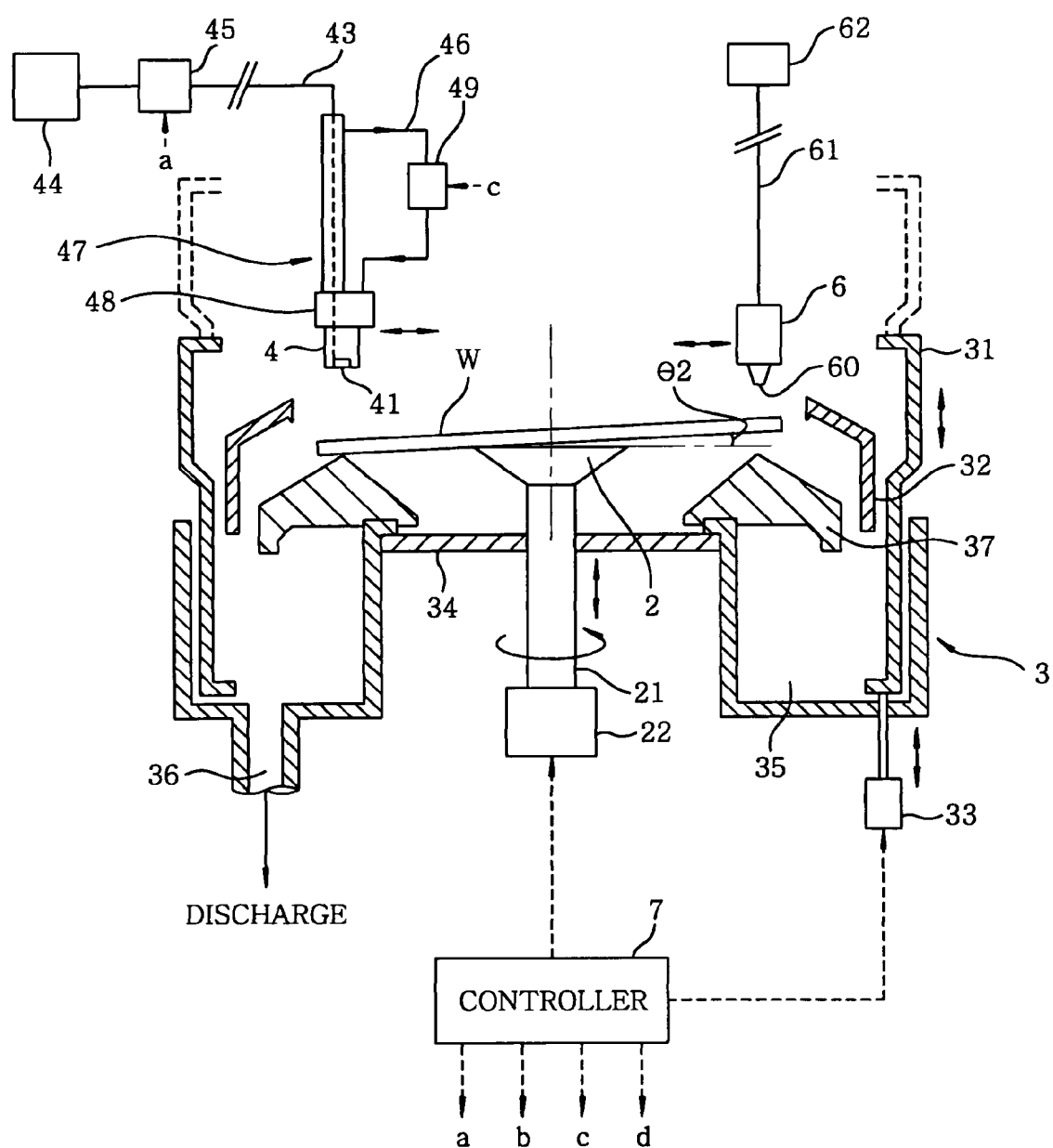
FIG. 10 shows a vertical sectional view of a developing apparatus in accordance with still another preferred embodiment of the present invention.

Hereinafter, a developing apparatus in accordance with still another preferred embodiment of the present invention will be described with reference to FIGS. 10 and 11. The developing apparatus of this embodiment has the same configuration as the apparatus described in FIG. 1 except that: the spin chuck 2 slantingly supports a central bottom surface of the wafer W with the help of vacuum adsorption; and the wafer W is not rotated forwardly and backwardly when the developer is discharged. Like reference numerals will be given to like parts and, further, a detailed explanation thereof will be omitted. The spin chuck 2 slantingly supports the wafer W at a specified angle θ2 selected within the range of, e.g., 1°~10°. Specifically, the guide member 52 is inclined at the same angle θ2, so that the developer nozzle 4 can slidably move in parallel with an inclined surface of the wafer W. A top end of the ring member 37 is also inclined.

Figure 11:
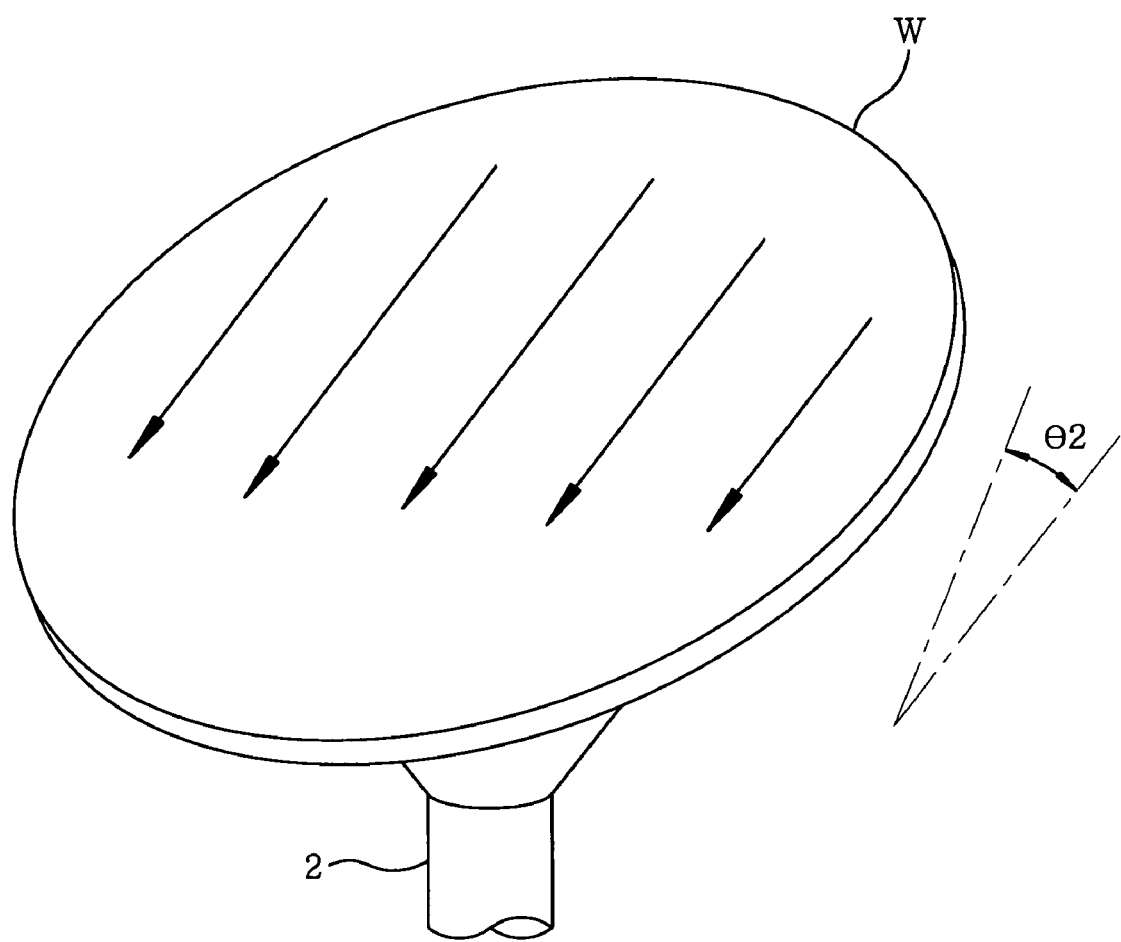
FIG. 11 illustrates a diagram for explaining a flow pattern of a developer supplied to a surface of a wafer.

In this case, although the wafer W is developed in the same sequence as in the aforementioned embodiment, since the wafer W is slantingly supported, the developer D flows downwardly along the inclined surface, as schematically illustrated in FIG. 11. Since the wafer W is being rotated while the developer D is coated thereon, if the rotational speed is set to range from 500 rpm to 1500 rpm (although the range will vary depending on the number of rotations), at a point on an upper portion of the inclined surface of the wafer W, the developer will flow from the outer portion to the central portion. On the other hand, at a point on a lower portion of the inclined surface of the wafer W, the developer will flow from the central portion to the outer portion. With such configuration, the aforementioned effects can be realized. Further, it is possible to use a configuration provided by combining at least two embodiments among those shown in FIGS. 1, 8 and 10.

Figure 12:
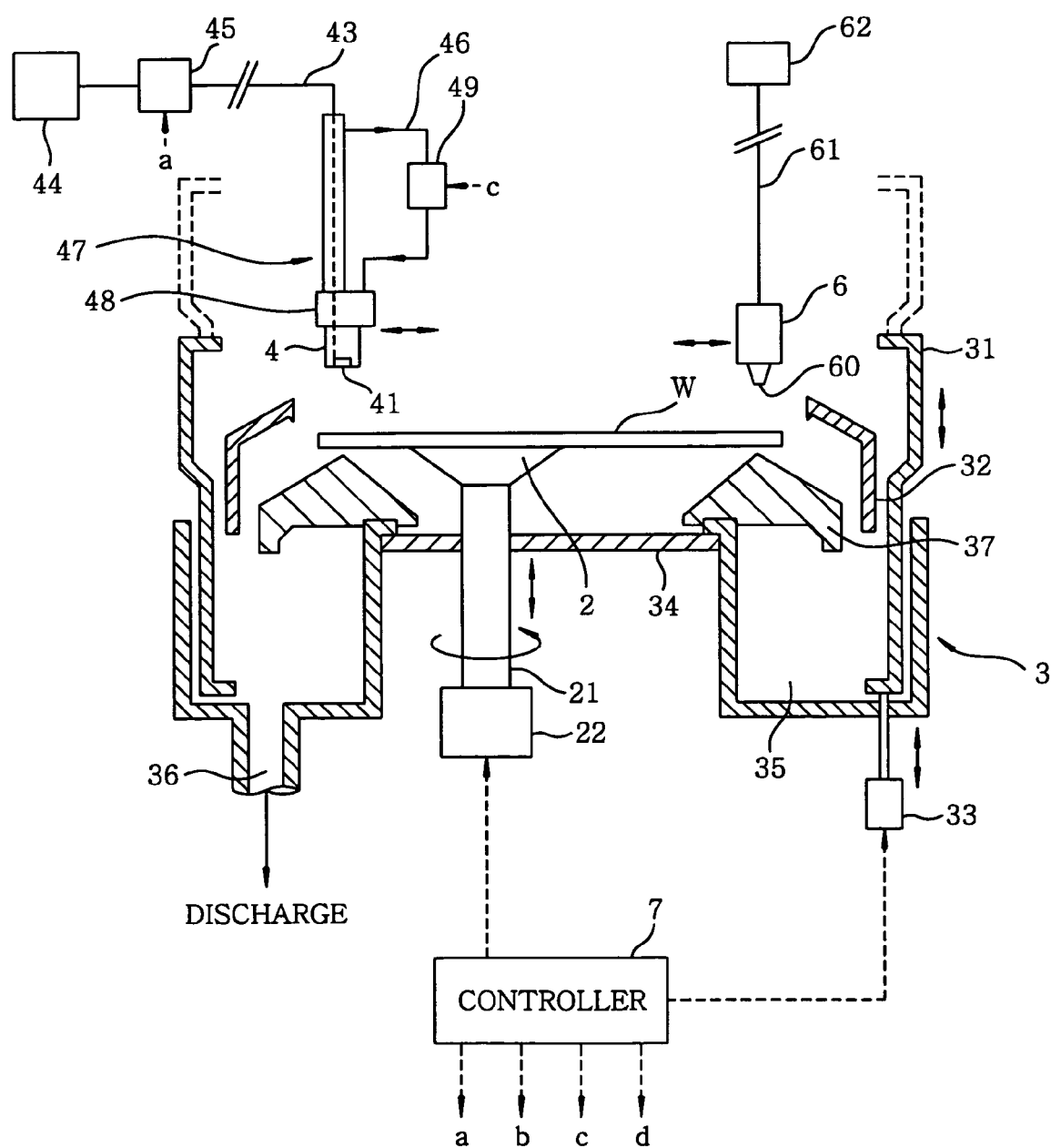
FIG. 12 provides a vertical sectional view of a developing apparatus in accordance with still another preferred embodiment of the present invention.

Hereinafter, a developing apparatus in accordance with still another embodiment of the present invention will be described with reference to FIGS. 12 and 13. The developing apparatus of this embodiment is of the same configuration as the apparatus described in FIG. 1 except that the spin chuck 2 horizontally supports the wafer W at an eccentric position by holding a bottom surface of the wafer W with the help of vacuum adsorption. Like reference numerals will be given to like parts and, further, a detailed explanation thereof will be omitted. Specifically, the wafer W is supported at the eccentric position and its rotational axis passes through the position. For example, the eccentric position can be a position 1 mm~15 mm separated away in a diametrical direction from the center of the wafer W whose diameter is 300 mm.

Figure 13:
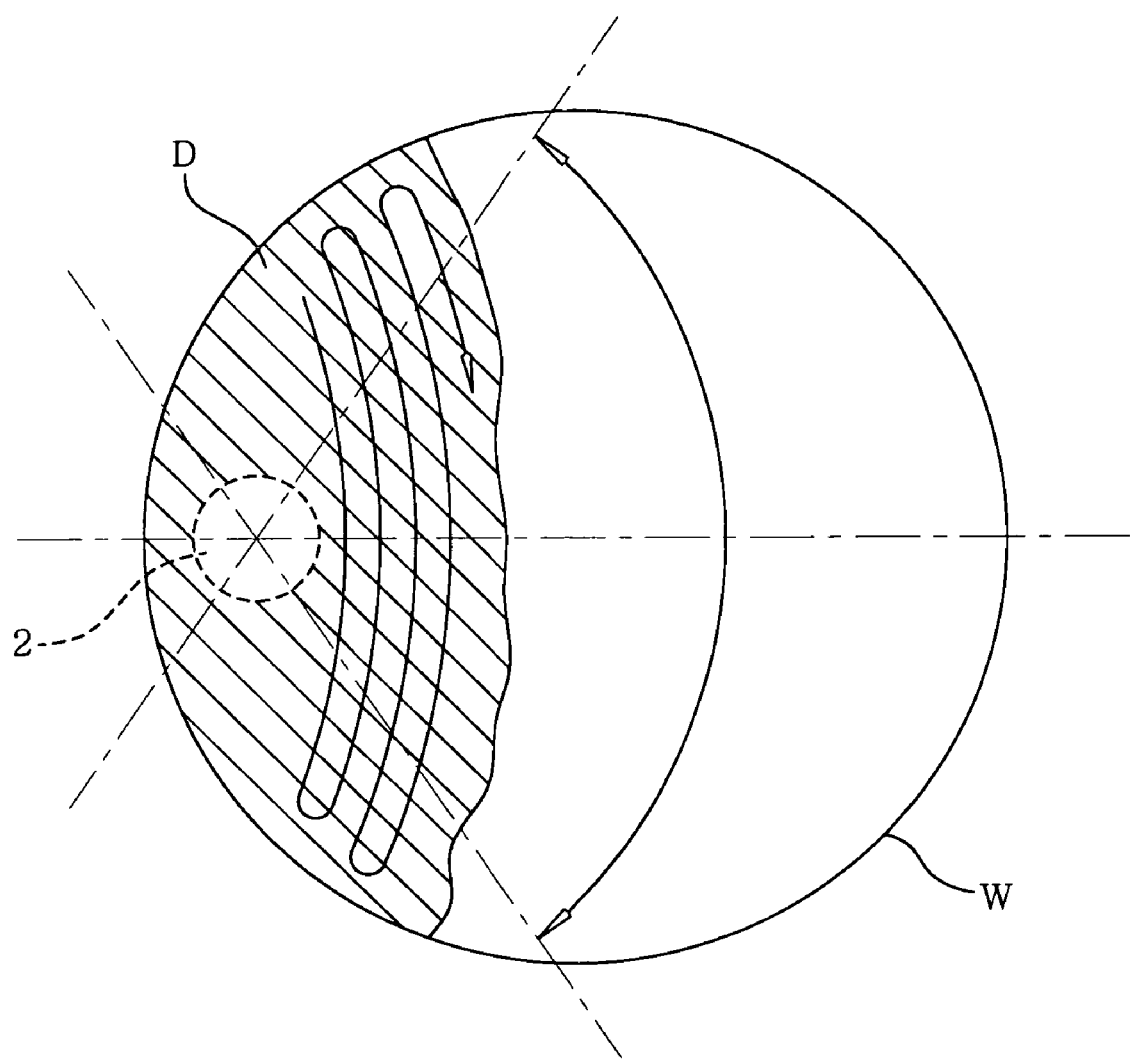
FIG. 13 depicts a diagram for explaining a flow pattern of a developer supplied to a surface of a wafer.

As depicted in FIG. 13, for example, the wafer W is oscillated so that a straight line passing through the eccentric position and the center of the wafer W is rotated left and right about the rotational axis by a specified angle of, e.g., 30°~90°. At the same time, the developer nozzle 4 slidably moves along an extended line connecting the rotational axis to the center of the wafer W from one end portion thereof that is close to the rotational axis to the other end portion thereof while discharging the developer D through the injection opening 41. Next, for example, at the moment the developer nozzle 4 reaches the other end portion of the wafer W, the rinse nozzle 6 begins to be slidably moved along the line from one end portion of the wafer W to the other end portion thereof while discharging a rinse through the injection opening 60. With such configuration, the aforementioned effects can also be realized.

In the present invention, the substrate can be, e.g., an LCD substrate and a reticle substrate for photomask without being limited to the wafer W. Further, the aforementioned configuration of the developer nozzle 4 can be applied to a coating solution nozzle for coating a resist on a substrate, for example.

Figure 14:
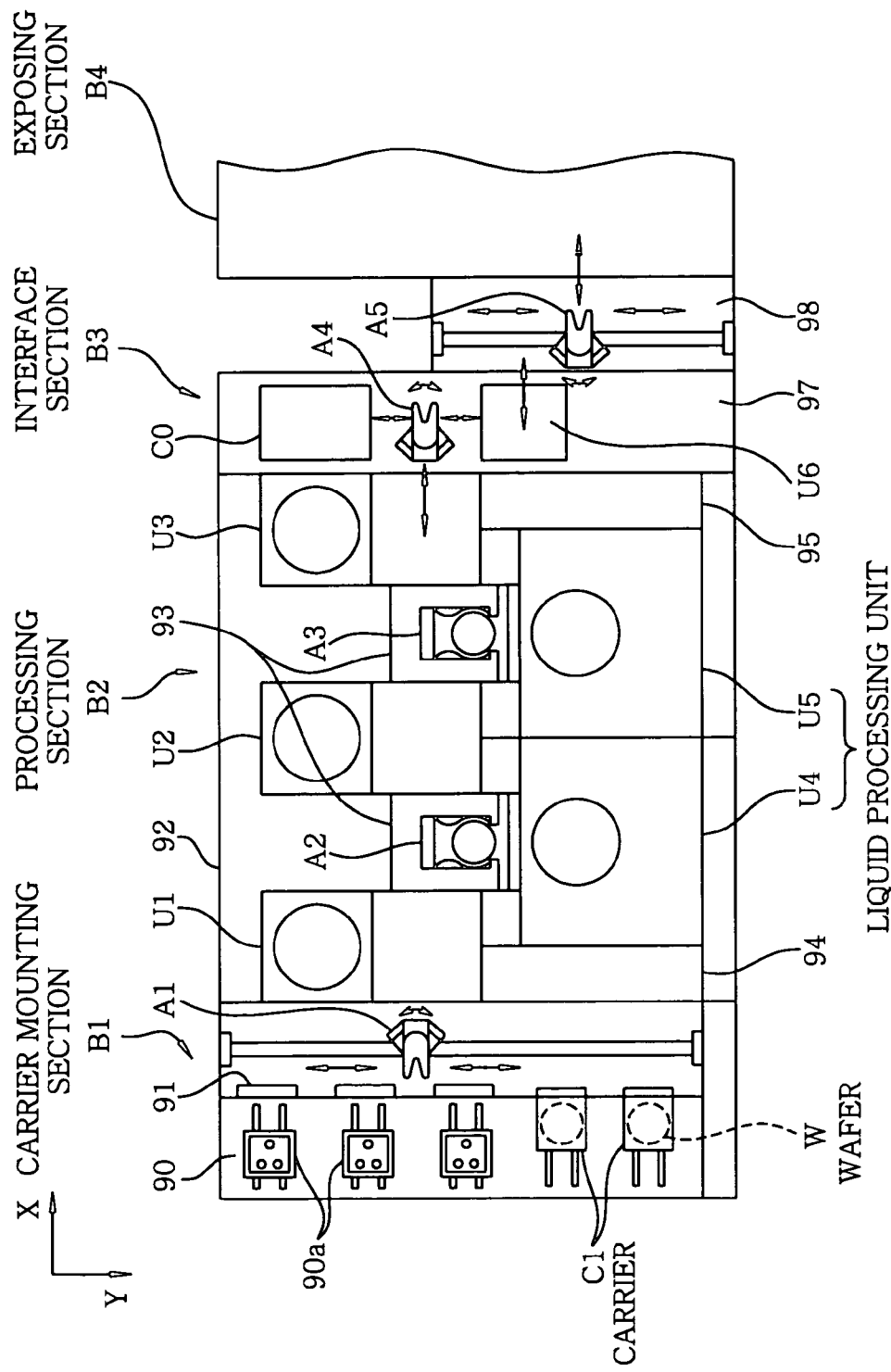
FIG. 14 presents a top view of an exemplary coating/developing apparatus including the developing apparatus.

Finally, an exemplary coating/developing apparatus accommodating therein the aforementioned developing apparatus will be briefly described with reference to FIGS. 14 and 15. A notation B1 indicates a carrier mounting section for loading/unloading carriers C1 accommodating therein, e.g., thirteen wafers W serving as a substrate in a sealed state. The carrier mounting section B1 includes carrier stations 90 having mounting portions 90a capable of mounting thereon a plurality of carriers C1; opening/closing members 91 provided on a wall surface in front of the carrier stations 90; and a transfer mechanism A1 for loading/unloading the wafer W to/from the carriers C1 via the opening/closing members 91.

A processing section B2 surrounded by a housing 92 is connected to the carrier mounting section B1. Alternately installed in the processing section B2 are rack units U1, U2 and U3, each having heating and cooling units in multiple levels, and main transfer mechanisms A2 and A3 for transferring the wafer W between processing units including coating and developing units to be described later. In other words, the rack units U1, U2 and U3 and the main transfer mechanisms A2 and A3 are alternately arranged in line and, further, openings (not shown) for transferring the wafer W are formed at connecting portions therebetween. Thus, the wafer W can be easily moved from the rack unit U1 provided at one end portion to the rack unit U3 provided at the other end portion in the processing section B2. Further, the main transfer mechanisms A2 and A3 are provided in a space surrounded by surface portions of rack units U1, U2 and U3 arranged in line; surface portions of liquid processing units U4 and U5 to be described later; and partition walls 93. Reference numerals 94 and 95 indicate temperature/humidity control units for a processing liquid used in each unit, having a temperature controller, a temperature/humidity control duct or the like.

Figure 15:
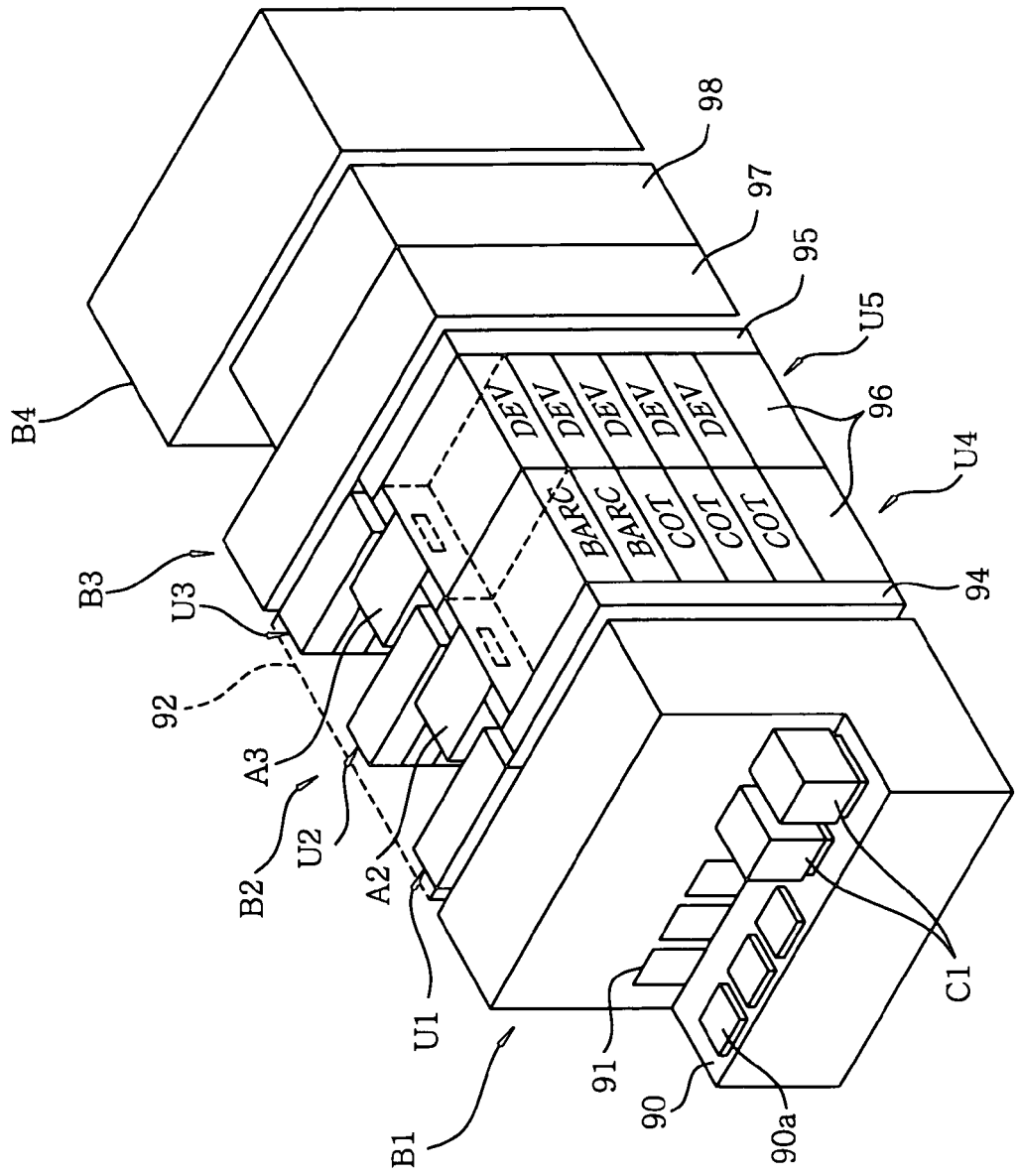
FIG. 15 represents a perspective view of the exemplary coating/developing apparatus including the developing system.
Figure 16A:
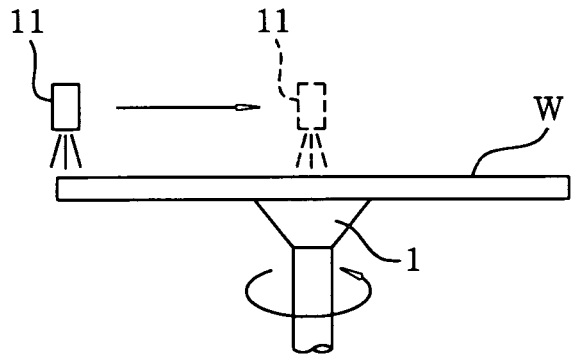
FIGS. 16A to 16C offer diagrams for explaining a conventional developing apparatus.
Figure 16B:
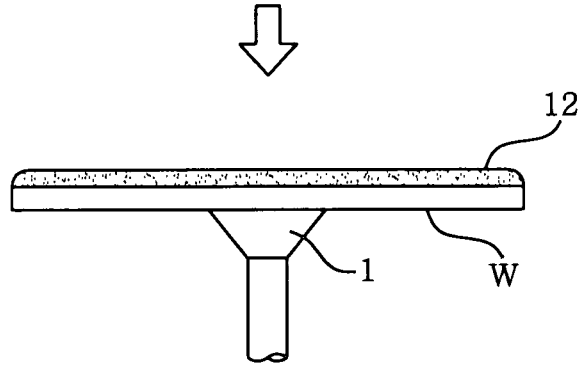
Figure 16C:
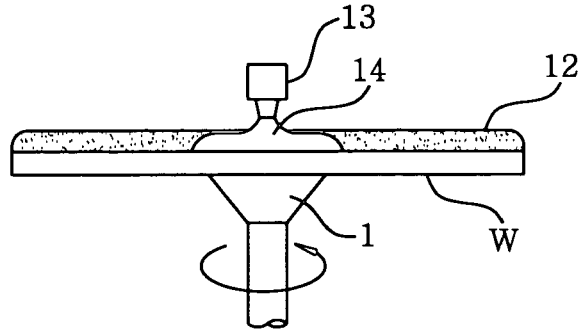
Figure 17:
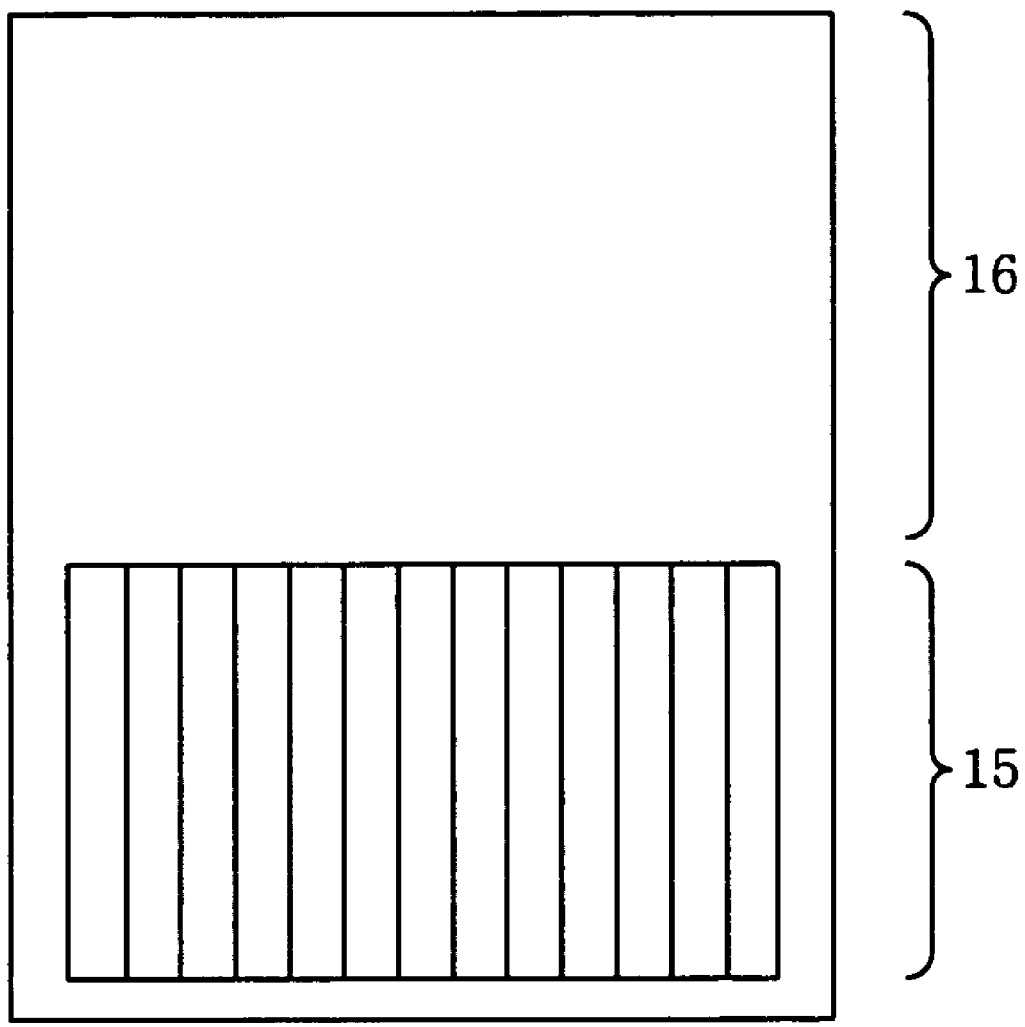
FIG. 17 sets forth a diagram for explaining another conventional developing apparatus.

As shown in FIG. 15, for example, each of the liquid processing units U4 and U5 has units such as a coating unit COT, a developing unit DEV having the developing apparatus in accordance with the present invention, a bottom anti-reflective coating unit BARC, which are provided in multiple levels, e.g., five levels, on an accommodating member 96 for supplying a liquid chemical such as a coating solution (resist solution) or a developer. Moreover, each of the aforementioned rack units U1, U2 and U3 includes various units, e.g., a heating unit for heating (baking) the wafer W and a cooling unit for cooling the wafer W, for carrying out a pre-treatment and a post-treatment of the processing performed by the liquid processing units U4 and U5, which are provided in multiple levels, e.g., ten levels.

An exposing section B4 is connected to the rack unit U3 of the processing section B2 via an interface section B3 including, e.g., a first transfer chamber 97 and a second transfer chamber 98. Installed inside the interface section B3 are two transfer mechanisms A4 and A5 for transferring the wafer W between the processing section B2 and the exposing section B4; a rack unit U6; and a buffer carrier C0.

There will be explained an exemplary wafer flow in the coating/developing apparatus. First of all, when the carrier C1 having therein the wafers W is mounted onto the mounting table 90, the opening/closing members 91 are opened and, at the same time, lids of the carriers C1 are removed, so that the wafers W can be unloaded by a transfer mechanism A1. Next, the wafer W is transferred to the main transfer mechanism A2 via a transfer unit (not shown) that occupies one level of the rack unit U1. Then, a pre-treatment of a coating process, e.g., an anti-reflective film forming process, is performed in the BARC, and a cooling process is carried out in one unit of the rack units U1 to U3. Thereafter, the resist solution is coated in the coating unit COT. Next, the wafer W is heated (baked) in the heating unit forming one unit of the rack units U1 to U3 and then cooled in the cooling unit to be loaded into the interface section B3 via a transfer unit of the rack unit U3. In the interface section B3, the wafer W is transferred through a transfer path of the transfer mechanism A4→the rack unit U6→the transfer mechanism A5 to the exposing section B4, wherein an exposure process is performed thereon. After the exposure process is completed, the wafer W is transferred to the main transfer mechanism A2 along the transfer path in a reversed order to be developed in the developing unit DEV, thereby forming a resist mask thereon. Thereafter, the wafer W returns to the original carrier C1 on the mounting table 90.

While the invention has been shown and described with respect to the preferred embodiments, it will be understood by those skilled in the art that various changes and modification may be made without departing from the spirit and scope of the invention as defined in the following claims.

What is claimed is:

1. A developing apparatus for developing a substrate whose surface is coated with a coating solution and then exposed, the apparatus comprising:
    a substrate supporting unit to slantingly support the substrate at an inclined angle;
    a rotation driving mechanism to rotate the substrate supporting unit with respect to a perpendicular axis;
    a developer nozzle, disposed to face a surface of the substrate supported by the substrate supporting unit, having a strip-shaped injection opening extended along a direction extending from a periphery of the substrate toward a central portion thereof;
    a moving unit to move the developer nozzle from an outer portion of the substrate toward the central portion thereof;
    a guide unit to support the moving unit, the guide unit being inclined at an angle that is equal to the inclined angle of the substrate such that the moving unit slidably moves the developer nozzle in parallel with the surface of the substrate while the substrate is rotated forwardly by the rotation driving mechanism; and
    a controller to control operations such that while the substrate is rotated forwardly by the rotation driving mechanism, a developer is supplied through the injection opening to the surface of the substrate by moving the developer nozzle.

2. The developing apparatus of claim 1, wherein the inclined angle ranges from 1° to 10°.

3. The developing apparatus of claim 1, wherein a length of the strip-shaped injection opening ranges from 8 mm to 15 mm, and a width of the strip-shaped injection opening ranges from 0.1 mm to 1 mm.

4. A developing apparatus for developing a substrate whose surface is coated with a coating solution and then exposed, the apparatus comprising:
    a substrate supporting unit to horizontally support the substrate;
    a rotation driving mechanism to rotate the substrate supporting unit with respect to a vertical axis, which is provided at an eccentric position on the substrate;
    a developer nozzle, disposed to face a surface of the substrate supported by the substrate supporting unit, having a strip-shaped injection opening extended along a direction extending from a periphery of the substrate toward a central portion thereof;
    a moving unit to move the developer nozzle from one end portion of the substrate toward an other end portion thereof, the end portions being positioned on a straight line passing through the eccentric position and the center of the substrate; and
    a controller to control operations of the rotation driving mechanism such that the substrate is oscillated left and right by the rotation driving mechanism and the developer nozzle is moved by the moving unit in a straight line such that the substrate does not complete an entire revolution while the developer is supplied through the injection opening to the entire surface of the substrate.

5. The developing apparatus of claim 4, wherein a length of the strip-shaped injection opening ranges from 8 mm to 15 mm, and a width of the strip-shaped injection opening ranges from 0.1 mm to 1 mm.

6. The developing apparatus of claim 4, wherein when the substrate is oscillated, the straight line passing through the eccentric position and the center of the substrate is rotated left and right about the vertical axis by a specified angle.

7. The developing apparatus of claim 6, wherein the specified angle ranges from 30° to 90°.

* * * * *